United States Patent
Aichholzer et al.

(10) Patent No.: US 10,858,282 B1
(45) Date of Patent: Dec. 8, 2020

(54) DOPED, LOW-TEMPERATURE CO-FIRED GLASS-CERAMIC (LTCC) INSULATING SUBSTRATES, AND RELATED WIRING BOARDS AND METHODS OF MANUFACTURE

(71) Applicant: QUALCOMM Incorporated, San Diego, CA (US)

(72) Inventors: Klaus Dieter Aichholzer, Deutschlandsberg (AT); Pavol Dudesek, Bad Gams (AT); Pascal Dotta, Eggersdorf bei Graz (AT)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/434,498

(22) Filed: Jun. 7, 2019

(51) Int. Cl.
    *H05K 1/03*     (2006.01)
    *C03C 10/00*     (2006.01)
    (Continued)

(52) U.S. Cl.
    CPC .......... *C03C 10/0045* (2013.01); *C03B 19/06* (2013.01); *C03C 4/16* (2013.01);
    (Continued)

(58) Field of Classification Search
    CPC .................................................. H05K 1/0306
    (Continued)

(56) References Cited

U.S. PATENT DOCUMENTS 5,256,600 A * 10/1993 Pfitzenmaier ........... C03C 1/105
    501/4
2004/0009863 A1 1/2004 Furuse et al.
(Continued)

FOREIGN PATENT DOCUMENTS

JP     2013155104 A     8/2013
WO     2016188767 A1     12/2016
WO     WO2016/1887676     * 12/2016     ............... H01B 3/02

OTHER PUBLICATIONS

Hanzaz, A., "LTCC System for High Frequency Applications," Proceedings of the International MultiConference of Engineers and Computer Scientists 2012 vol. II, IMECS 2012, Mar. 14-16, 2012, Hong Kong, 4 pages.
International Search Report and Written Opinion for International Patent Application No. PCT/US2020/070115, dated Sep. 17, 2020, 12 pages.

*Primary Examiner* — Stanley Tso
(74) *Attorney, Agent, or Firm* — Withrow & Terranova, PLLC

(57) ABSTRACT

Doped, low-temperature co-fired ceramic (LTCC) insulating substrates and related wiring boards and methods of manufacture are disclosed. The doped, LTCC insulating substrate is formed from a baked (e.g., sintered) glass-ceramic aggregate material formed from a glass material, a ceramic filler material, and a composite oxide. The crystallized glass-ceramic aggregate is then doped with Iron and/or Manganese before baking. Iron or Manganese can further reduce dielectric loss and the loss tangent of the LTCC insulating substrate formed from that glass material. The glass material becomes crystallized due to an oxide crystal phase being deposited on the glass material during baking, which reduces the dielectric losses. This may be important for the application use as wiring boards for high radio-frequency (RF) electrical circuits where low dielectric loss and loss tangent is desired to achieve a desired signal transmission delay performance.

9 Claims, 8 Drawing Sheets

(51) Int. Cl.
*C03C 4/16* (2006.01)
*C03C 14/00* (2006.01)
*C03B 19/06* (2006.01)
*H05K 3/46* (2006.01)
*H05K 3/00* (2006.01)
*H05K 1/09* (2006.01)

(52) U.S. Cl.
CPC ......... *C03C 14/004* (2013.01); *H05K 1/0306* (2013.01); *H05K 3/0055* (2013.01); *H05K 3/4655* (2013.01); *C03B 2201/40* (2013.01); *C03C 2204/00* (2013.01); *H05K 1/09* (2013.01); *H05K 2201/0209* (2013.01); *H05K 2203/1194* (2013.01)

(58) Field of Classification Search
USPC ...................................................... 174/256
See application file for complete search history.

(56) References Cited

U.S. PATENT DOCUMENTS

| | | | | |
|---|---|---|---|---|
| 2007/0237935 A1* | 10/2007 | Mori | ........................ | C03C 3/066 428/210 |
| 2011/0177648 A1* | 7/2011 | Tanner | .............. | H01L 21/67236 438/72 |
| 2016/0200620 A1* | 7/2016 | Ochs | ................. | C03B 37/01413 65/32.3 |

* cited by examiner

DOPED, LOW-TEMPERATURE CO-FIRED GLASS-CERAMIC (LTCC) INSULATING SUBSTRATES, AND RELATED WIRING BOARDS AND METHODS OF MANUFACTURE

BACKGROUND

I. Field of the Disclosure

The field of the disclosure relates to glass-ceramic insulating substrates, and more particularly to low-temperature co-fired ceramic (LTCC) insulating substrates used as electrical wiring boards (e.g., printed circuit boards (PCBs)) in which electrical components, such as semiconductor devices, are mounted.

II. Background

Alumina substrates employing alumina have been used as substrates for fabricating electrical wiring boards on which electrical components, including semiconductor devices, are mounted. Alumina substrates have an advantage of high strength and excellent heat resistance. However, alumina substrates may have a high dielectric constant, and thus may be problematic for electrical circuits that handle higher frequency applications, as a higher dielectric constant results in a higher signal transmission delay. Alumina substrates are also baked at higher temperatures, such as 1500 degrees Celsius or above, making it necessary to use high melting point metal materials, such as Tungsten (W) or Molybdenum (Mo), for metal wiring formed in wiring layers of the substrate when producing a wiring board. However, higher melting point metals may have a higher electrical impedance, also leading to higher signal transmission delays.

Low-temperature-baked substrates employing glass-ceramics have also been used as substrates for fabricating electrical wiring boards to address issues with alumina substrates. Low-temperature glass-ceramic materials that are co-fired with metal conductors at low temperatures are known as low-temperature co-fired ceramic (LTCC) materials. Low-temperature glass-ceramic materials have a lower dielectric constant than alumina substrates. Low-temperature glass-ceramic materials also support use of a lower melting point, lower resistance metal materials (e.g., Silver (Ag) or a Silver-Palladium (Pd) alloy (Ag—Pd)) for forming metal wiring. Glass-ceramic materials are produced by mixing a glass material with a ceramic material, such as alumina, to form an aggregate mixture, which is then baked. The glass-ceramic aggregate mixture produces a synergistic action when it is baked because of the combination of the glass material and the ceramic material, which makes it possible to control performance characteristics of the resulting ceramic substrate, including its dielectric constant, loss characteristics, thermal expansion coefficient, and baking temperature. Different combinations of glass material, ceramic filler, and other materials used to form the aggregate mixture can be experimented with to arrive at the desired performance characteristics as an insulating substrate for an electrical wiring board. For example, in high radio-frequency (RF) applications, at frequencies below 6 Gigahertz (GHz), losses are dominated by metal losses. However, for millimeter (mm) wave applications (e.g., 28 GHz, 39 GHz, and 60 GHz) and automotive radar (e.g., 24 GHz, 77/79 GHz), dielectric losses play a more significant role than metal losses in frequency performance. The dielectric constant and dielectric loss tangent for a low-temperature glass-ceramic material may not be suitably low enough to achieve an acceptable dielectric loss for an acceptable signal transmission delay for these higher frequency applications.

Devitrifiable glass is being used as the glass material in a low-temperature glass-ceramic material to increase the crystallinity of the glass-ceramic material and reduce its dielectric constant as a result. The crystallinity of the glass-ceramic material is increased by depositing specific crystals in the aggregate glass-ceramic mixture during baking. However, a large quantity of heat is required to be applied during baking to increase the crystallinity of the glass. Increased temperatures during baking can lead to diffusion of metal wiring into the glass material of the glass-ceramic insulating substrate.

SUMMARY OF THE DISCLOSURE

Aspects disclosed herein include doped, low-temperature co-fired glass-ceramic (LTCC) insulating substrates. Wiring boards fabricated from the LTCC insulating substrates, and related methods of manufacture of the LTCC insulating substrates and wiring boards are also disclosed. The LTCC insulating substrates may be used as electrical wiring boards (e.g., printed circuit boards (PCBs)) in which electrical components, such as passive electrical devices and semiconductor devices, are formed or mounted. The wiring boards may be formed from LTCC insulating substrates by forming surface-layer conductor patterns and inner-layer conductor patterns on the LTCC insulating substrates, which are then stacked on top of each other to form a multilayer structure. The LTCC insulating substrate is formed from a glass material. The glass material can include Magnesium (Mg), Calcium (Ca), and Silicon (Si), as examples. A glass-ceramic aggregate is formed from the glass material, a ceramic filler material, and a composite oxide. The ceramic filler may be an Aluminum Oxide ($Al_2O_3$), as an example. The composite oxide may include Aluminum (Al) and/or Cobalt (Co), as examples. The glass-ceramic aggregate is doped with Iron (Fe) and/or Manganese (Mn), which may get similar ionic radii and oxidation states, to form a doped, glass-ceramic aggregate. It has been found unexpectedly that doping the glass-ceramic aggregate with Iron (Fe) or Manganese (Mn) can further reduce the loss tangent of the LTCC insulating substrate (e.g., from $\{18.0$ to $10.0\} \times 10^{-4}$ @ 60 GHz) formed from the glass material, which may be important for the application use as a wiring board for high radio-frequency (RF) electrical circuits (e.g., >24 Gigahertz (GHz)) where low dielectric loss and loss tangent is desired to achieve the desired signal transmission delay performance. The LTCC insulating substrate is formed by baking (e.g., sintering) the doped, glass-ceramic aggregate mixture that includes the glass material, a ceramic filler material, and a composite oxide. A crystal phase, such as a diopside oxide crystal phase for example, is deposited in the glass material of the doped, glass-ceramic aggregate during baking to increase crystallinity of the glass material and reduce the dielectric constant of the LTCC insulating substrate formed from the doped, glass-ceramic aggregate.

In this regard, in one exemplary aspect, a doped, glass-ceramic substrate is provided. The doped, glass-ceramic substrate comprises a crystallized glass-ceramic aggregate, comprising a crystalized glass on which an oxide crystal phase is deposited, a ceramic filler material, and a composite oxide. The doped glass ceramic substrate also comprises a doping material comprising at least one of Iron (Fe) and Manganese (Mn) in oxide form.

In another exemplary aspect, an electrical wiring board is provided. The electrical wiring board comprises at least one insulating layer and at least one wiring conductor integrated into the at least one insulating layer. Each at least one insulating layer comprises a crystallized glass-ceramic aggregate comprising a crystalized glass on which an oxide crystal phase is deposited, a ceramic filler material, and a composite oxide, and a doping material doped at a doping concentration in the crystallized glass-ceramic aggregate, the doping material comprising at least one of Iron (Fe) and Manganese (Mn) (e.g., as oxides).

In another exemplary aspect, a method of fabricating a doped, crystallized glass-ceramic substrate of an electrical wiring board is provided. The method of fabricating a doped, crystallized glass-ceramic substrate comprises mixing a ceramic filler material and composite oxide with a glass material to form a glass-ceramic aggregate. The method also comprises doping the glass-ceramic aggregate with a doping material at a doping concentration to form a doped, glass-ceramic aggregate, the doping material comprising at least one of Iron (Fe) and Manganese (Mn). The method also comprises forming the doped, glass-ceramic aggregate into a doped, glass-ceramic aggregate slurry or paste. The method also comprises spreading at least a portion of doped, glass-ceramic aggregate slurry or paste in a film. The method also comprises forming a conductor pattern in the film. The method also comprises removing an organic vehicle by heat treatment and baking the film at a temperature below 1000 degrees Celsius.

DETAILED DESCRIPTION

Figure 1:
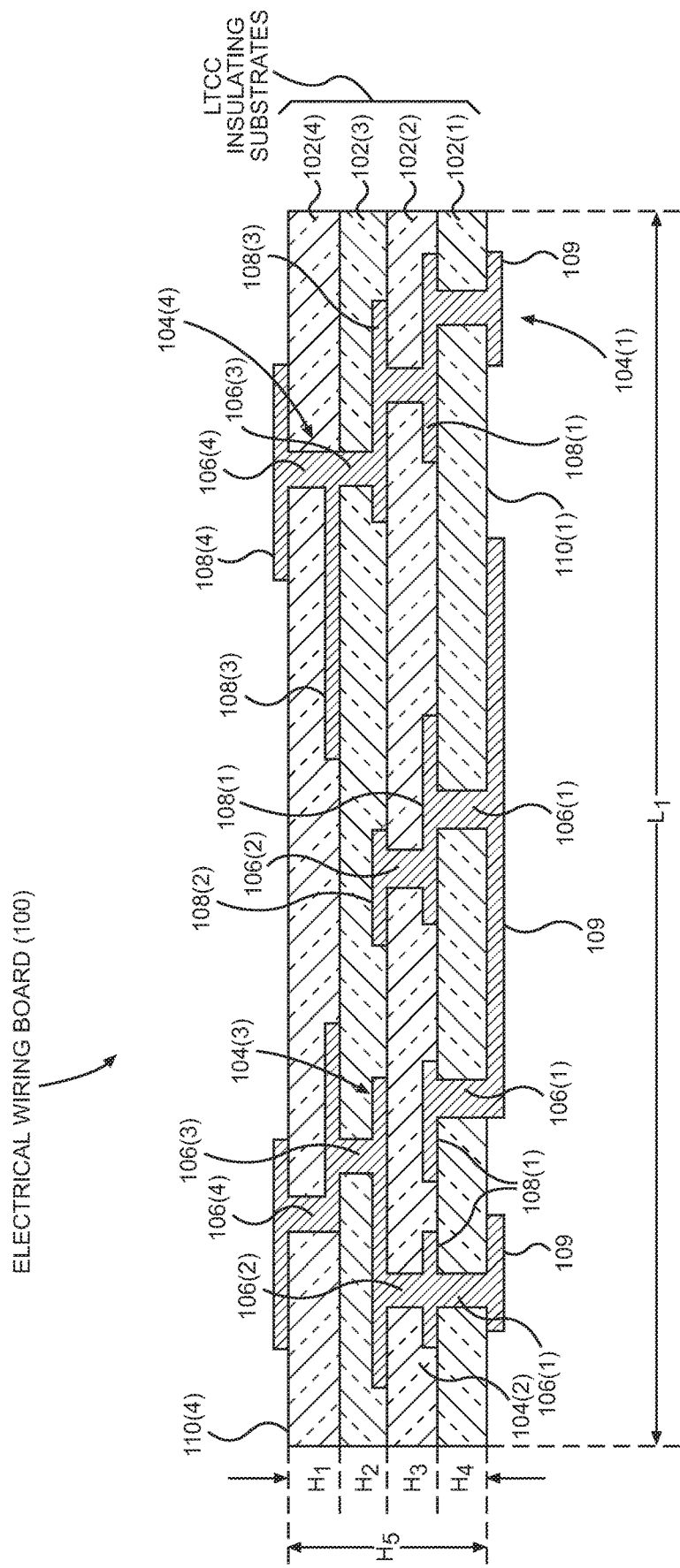
FIG. 1 is a cross-sectional view of an exemplary electrical wiring board employing stacked layers, building up an Iron- or Manganese-doped, low-temperature co-fired glass-ceramic (LTCC) insulating substrate having a reduced dielectric loss and loss tangent.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include doped, low-temperature co-fired glass-ceramic (LTCC) insulating substrates. Wiring boards fabricated from the LTCC insulating substrates, and related methods of manufacture of the LTCC insulating substrates and wiring boards are also disclosed. The LTCC insulating substrates may be used as electrical wiring boards (e.g., printed circuit boards (PCBs)) in which electrical components, such as passive electrical devices and semiconductor devices, are formed or mounted. The wiring boards may be formed from LTCC insulating substrates by forming surface-layer conductor patterns and inner-layer conductor patterns on the LTCC insulating substrates, which are then stacked on top of each other to form a multilayer structure. The LTCC insulating substrate is formed from a glass material. The glass material can include Magnesium (Mg), Calcium (Ca), and Silicon (Si), as examples. A glass-ceramic aggregate is formed from the glass material, a ceramic filler material, and a composite oxide. The ceramic filler may be an Aluminum Oxide ($Al_2O_3$), as an example. The composite oxide may include Aluminum (Al) and/or Cobalt (Co), as examples. The glass-ceramic aggregate is doped with Iron (Fe) and/or Manganese (Mn), which may get similar ionic radii and oxidation states, to form a doped, glass-ceramic aggregate. It has been found unexpectedly that doping the glass-ceramic aggregate with Iron (Fe) or Manganese (Mn) can further reduce the loss tangent of the LTCC insulating substrate (e.g., from $\{18.0$ to $10.0\} \times 10^{-4}$ @ 60 GHz) formed from the glass material. This may be important for the application use as a wiring board for high radio-frequency (RF) electrical circuits (e.g., >24 Gigahertz (GHz)) where low dielectric loss and loss tangent is desired to achieve the desired signal transmission performance and/or reduce attenuation/loss. The LTCC insulating substrate is formed by baking (e.g., sintering) the doped, glass-ceramic aggregate mixture that includes the glass material, a ceramic filler material, and a composite oxide. A crystal phase, such as a diopside oxide crystal phase for example, is deposited in the glass material of the doped, glass-ceramic aggregate during baking to increase crystallinity of the glass material and reduce the dielectric constant of the LTCC insulating substrate formed from the doped, glass-ceramic aggregate.

In this regard, FIG. 1 is a cross-sectional view of an exemplary electrical wiring board 100 employing stacked, Iron- or Manganese-doped, low-temperature co-fired glass-ceramic (LTCC) layers 102(1)-102(4) having a reduced dielectric loss to form a LTCC insulating substrate. In this example, there are four (4) doped, LTCC insulating layers 102(1)-102(4) stacked on top of each other to form the electrical wiring board 100, but such is not limiting. As will be discussed in more detail below, the doped, LTCC insulating layers 102(1)-102(4) may be fabricated by baking a single green substrate sheet, or they may be fabricated by baking a stack that includes a plurality of green substrate sheets. As a non-limiting example, the doped, LTCC insulating layers 102(1)-102(4) may each have a length $L_1$ between 50-200 millimeters (mm), and a height or thickness $H_1$, $H_2$, $H_3$, $H_4$ of 0.2-1.5 mm each for a total height $H_5$ of 0.8 to 6.0 mm. Each of the doped, LTCC insulating layers 102(1)-102(4) in this example include wiring conductors 104(1)-104(4) for establishing conductive paths between electrical components mounted on the electrical wiring board 100 to provide a circuit(s). In this example, the wiring conductors 104(1)-104(4) include inter-layer conductors 106(1)-106(4) in the form of vertical interconnect accesses (vias) that pass through respective doped, LTCC insulating layers 102(1)-102(4) and contact inner-layer conductors 108(1)-108(4) present at different positions in the doped, LTCC insulating layers 102(1)-102(4). The inner-layer conductors 108(1)-108(4) are located on the outer surfaces 110(1), 110(4) of their respective doped, LTCC insulating layers 102(1)-102(4) for making connections externally to the electrical wiring board 100. Outer surface conductors 109 are formed on the LTCC insulating layer 102(1) and connected to inter-layer conductors 106(1). The inner-layer conductors 108(1)-108(4) and outer surface conductors 109 are formed on the doped, LTCC insulating layers 102(1)-102(4) in predetermined conductor patterns. It should be noted that in the exemplary electrical wiring board in FIG. 1, the inter-layer conductors 106(1)-106(4) connect to the inner-layer conductors 108(1)-108(4) present in different LTCC layers 102(1)-102(4), but this example is non-limiting.

It may be desired to use the electrical wiring board 100 in FIG. 1 to support radio-frequency (RF) electrical circuits (e.g., >24 Gigahertz (GHz)) where low dielectric loss and loss tangent is desired to achieve a desired signal transmission delay performance. To provide the doped, LTCC insulating layers 102(1)-102(4) in the electrical wiring board 100 with the desired insulating properties and low dielectric constant and loss tangent, in this example, the doped, glass-ceramic substrate includes a doped, crystallized glass-ceramic aggregate. The doped, crystallized glass-ceramic aggregate is formed from a mixture of glass material, a ceramic filler material, and a composite oxide. For example, the glass material may include Silicon (Si), Magnesium (Mg), Calcium (Ca), and/or Aluminum (Al). Also for example, the ceramic filler may be Aluminum Oxide ($Al_2O_3$). Also for example, the composite oxide may include Aluminum (Al), Cobalt (Co), and/or Titanium (Ti). The doped, crystallized glass-ceramic aggregate is formed by providing a glass material, and then mixing the glass material with a ceramic filler material and a composite oxide and doping into an aggregate mixture, which is then baked at lower temperature (e.g., usually below 1000 degrees Celsius) such that a lower melting point, low-resistance metal, such as Silver (Ag), can be used as a conductor for reduced signal delay performance. The baking of this aggregate mixture causes an oxide crystal phase to be deposited in the glass, thereby depositing crystals in the glass material. For example, the oxide crystal phase may be a diopside oxide crystal phase. Glass crystallinity can reduce the dielectric constant of the doped, crystallized glass-ceramic aggregate, thus reducing the dielectric constant of a LTCC insulating substrate formed from the glass-ceramic aggregate for increased signal performance.

The loss tangent of the LTCC insulating layers 102(1)-102(4) formed from this exemplary doped, crystallized glass-ceramic aggregate may not be low enough to support a desired signal transmission delay performance in a high RF electrical circuit (e.g., >24 GigaHertz (GHz)). Thus, in examples discussed below in more detail, the glass-ceramic aggregate is doped with Iron (Fe) and/or Manganese (Mn) before baking. Iron (Fe) and Manganese (Mn) may get similar ionic radii and oxidation states and act in the glass-ceramic aggregate similar way. It has been found unexpectedly that doping the glass-ceramic aggregate with Iron (Fe) and Manganese (Mn) can further reduce dielectric loss of a LTCC insulating substrate of the LTCC insulating layer 102(1)-102(4) (e.g., from $\{18.0$ to $10.0\} \times 10^{-4}$ @ 60 GHz) formed from the glass material. This may be important for the application use as a wiring board for high radio-frequency (RF) electrical circuits (e.g., >24 Gigahertz (GHz)) where low dielectric loss and loss tangent is desired to achieve a desired signal transmission performance. This is shown in the example graphs 200, 202 in FIGS. 2A and 2B discussed below.

Figure 2A:
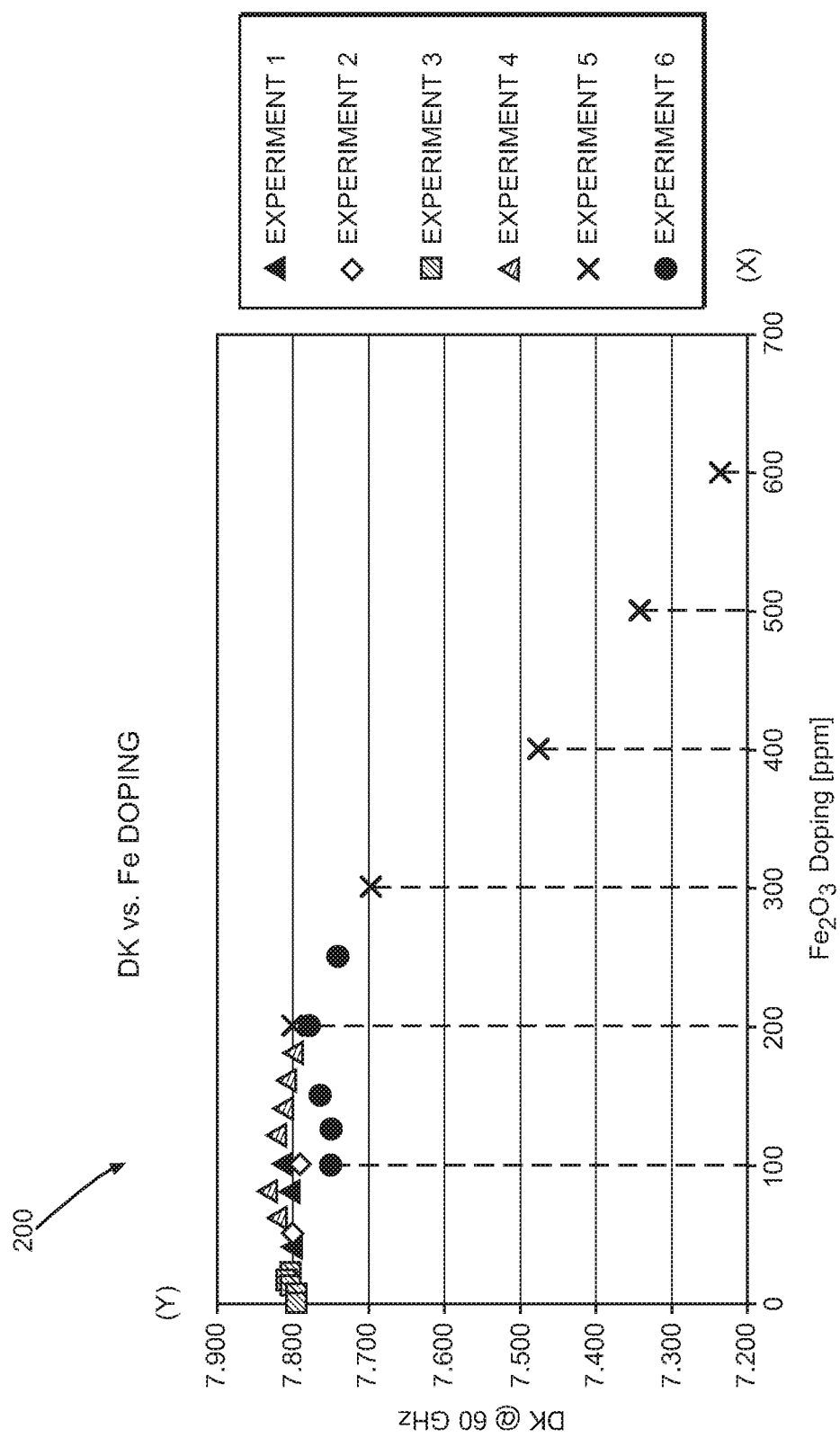
FIG. 2A is a graph illustrating an exemplary graph of a dielectric constant of an Iron-doped glass material for a given level of Iron Oxide ($Fe_2O_3$) doping in a glass-ceramic material aggregate that can be used to form a doped, LTCC insulating substrate with a reduced dielectric loss.

FIG. 2A is a graph illustrating an exemplary graph 200 of a dielectric constant (DK) of the above-described doped, crystallized glass-ceramic aggregate for a given level of Iron Oxide ($Fe_2O_3$), which can be used to form doped, LTCC insulating substrates, including the doped, LTCC insulating layers 102(1)-102(4) in the electrical wiring board 100 in FIG. 1, with a reduced dielectric loss. In this regard, the X-axis of graph 200 shows the content of Iron Oxide ($Fe_2O_3$) in parts-per-million (ppm) in the doped, crystallized glass-ceramic aggregate. The Y-axis of graph 200 shows the dielectric constant (DK) of the doped, crystallized glass-ceramic aggregate at 60 GHz. A number of experiments, labeled Experiments 1-6, were carried out to test the dielectric constant (DK) of the doped, crystallized glass-ceramic aggregate at 60 GHz for a number of different concentrations of Iron Oxide ($Fe_2O_3$) doped into the doped, crystallized glass-ceramic aggregate. As shown in FIG. 2A, at 0 ppm Iron Oxide ($Fe_2O_3$) doping, the dielectric constant (DK) of the doped, crystallized glass-ceramic aggregate at 60 GHz is approximately 7.8. At 100 ppm Iron Oxide ($Fe_2O_3$) doping in the experiments that included such a doping level, the dielectric constant (DK) of the doped, crystallized glass-ceramic aggregate at 60 GHz drops to approximately 7.8-7.75. At 200 ppm Iron Oxide ($Fe_2O_3$) doping in the experiments that included such a doping level, the dielectric constant (DK) of the doped, crystallized glass-ceramic aggregate at 60 GHz is approximately 7.8-7.75. At 300 ppm Iron Oxide ($Fe_2O_3$) doping in the experiments that included such a doping level, the dielectric constant (DK) of the doped, crystallized glass-ceramic aggregate at 60 GHz drops to approximately 7.7. At 400 ppm Iron Oxide ($Fe_2O_3$) doping in the experiments that included such a doping level, the dielectric constant (DK) of the doped, crystallized glass-ceramic aggregate at 60 GHz drops to approximately 7.475. At 500 ppm Iron Oxide ($Fe_2O_3$) doping in the experiments that included such a doping level, the dielectric constant (DK) of the doped, crystallized glass-ceramic aggregate at 60 GHz drops to approximately 7.35. At 600 ppm Iron Oxide ($Fe_2O_3$) doping in the experiments that included such a doping level, the dielectric constant (DK) of the doped, crystallized glass-ceramic aggregate at 60 GHz drops to approximately 7.24.

Figure 2B:
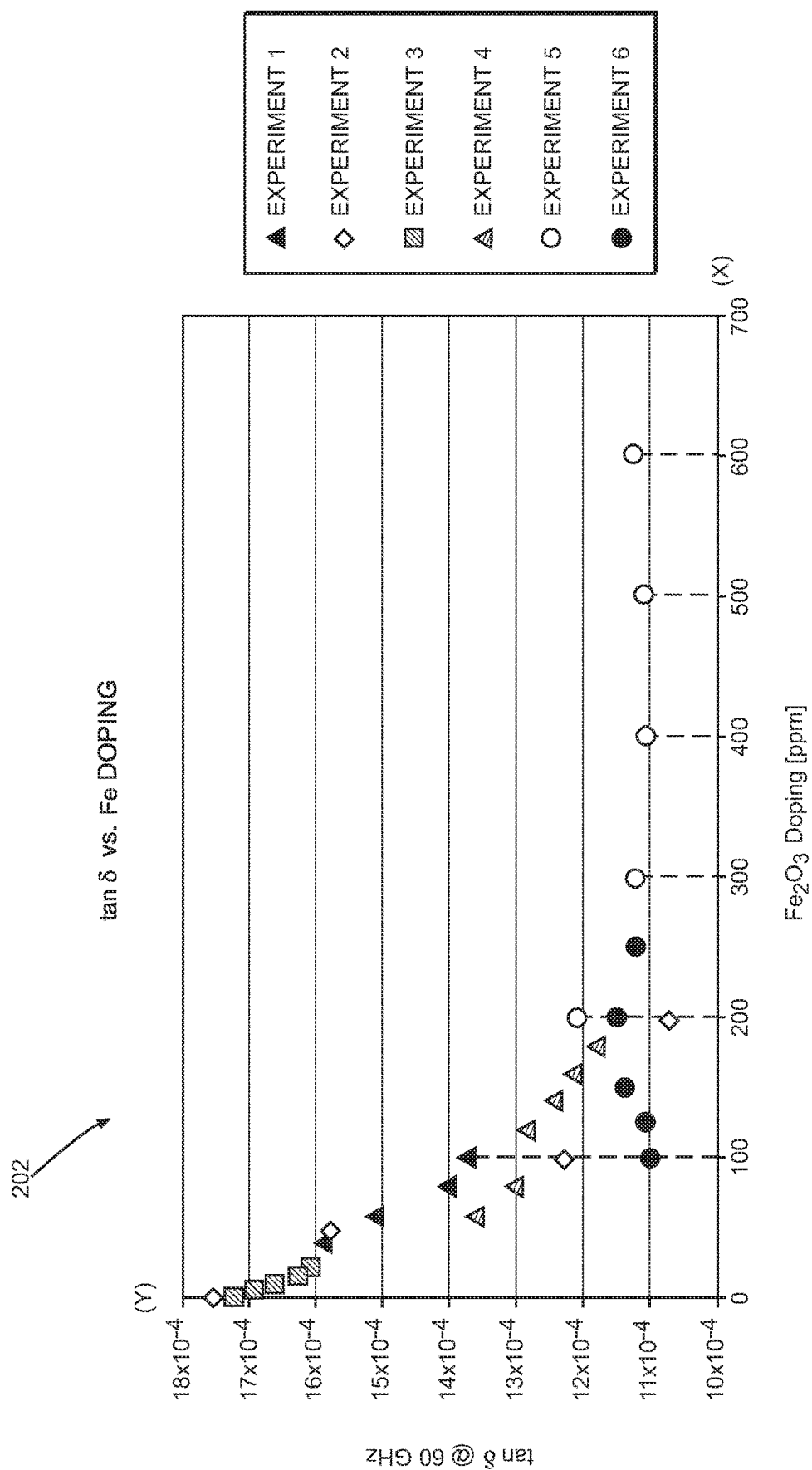
FIG. 2B is a graph illustrating an exemplary graph of a loss tangent of an Iron-doped glass material for a given level of Iron Oxide ($Fe_2O_3$) doping in a glass-ceramic aggregate that can be used to form a doped, LTCC insulating substrate with a reduced loss tangent.

FIG. 2B is a graph illustrating an exemplary graph 202 of a loss tangent (tan 6) of the above-described doped, crystallized glass-ceramic aggregate for a given level of Iron Oxide ($Fe_2O_3$), which can be used to form doped, LTCC insulating substrates, including the doped, LTCC insulating layers 102(1)-102(4) in the electrical wiring board 100 in FIG. 1, with a reduced dielectric loss. In this regard, the X-axis of graph 202 shows the content of Iron Oxide ($Fe_2O_3$) in parts-per-million (ppm) in the doped, crystallized glass-ceramic aggregate. The Y-axis of graph 202 shows the dielectric loss in the form of tan 6 of the doped, crystallized glass-ceramic aggregate at 60 GHz. A number of experiments, labeled Experiments 1-6, were carried out to test the loss tangent (tan 6) of the doped, crystallized glass-ceramic aggregate at 60 GHz for a number of different samples with different concentrations of Iron Oxide ($Fe_2O_3$) doped into the doped, crystallized glass-ceramic aggregate. As shown in FIG. 2B, without doping, e.g., 0 ppm Iron Oxide ($Fe_2O_3$), the loss tangent (tan 6) of the undoped, crystallized glass-ceramic aggregate at 60 GHz is approximately $17.5 \times 10^4$ or higher. In the experiments with doping of 100 ppm Iron Oxide ($Fe_2O_3$), the loss tangent (tan 6) of the doped, crystallized glass-ceramic aggregate at 60 GHz drops to approximately $13.75-11 \times 10^{-4}$. In the experiments with doping of 200 ppm Iron Oxide ($Fe_2O_3$), the tan 6 of the doped, crystallized glass-ceramic aggregate at 60 GHz drops to approximately $12.1 \times 10^{-4} - 10.8 \times 10^{-4}$. In the experiments with doping of 300 ppm Iron Oxide ($Fe_2O_3$), the loss tangent of the doped, crystallized glass-ceramic aggregate at 60 GHz drops to approximately $11.2 \times 10^{-4}$. In the experiments with doping of 400 ppm Iron Oxide ($Fe_2O_3$), the loss tangent of the doped, crystallized glass-ceramic aggregate at 60 GHz drops to approximately $11 \times 10^{-4}$. At certain levels of doping, the loss tangent of the doped, crystallized glass-ceramic aggregate increases again. For example, as shown in FIG. 2B, in the experiments with doping of 400 ppm Iron Oxide ($Fe_2O_3$), the loss tangent of the doped, crystallized glass-ceramic aggregate at 60 GHz drops to approximately $11.0 \times 10^{-4}$. In the experiments with doping of 500 ppm and 600 ppm Iron Oxide ($Fe_2O_3$), the loss tangent of the doped, crystallized glass-ceramic aggregate at 60 GHz drops to approximately 11.1 and $11.3 \times 10^{-4}$, respectively.

This doped, LTCC insulating substrate of the sintered glass-ceramic aggregate discussed above and in more detail below has a sufficient sintered density and a low dielectric loss, particularly in high RF regions of 24 GHz and above. These characteristics can be achieved under baking conditions involving a small quantity of heat, such that there is little fluctuation in characteristics with respect to the baking conditions (in particular baking time). The sintered, doped, glass-ceramic aggregate can be baked at a low temperature of 1000 degrees Celsius or less, such that it is possible to form conductor layers using lower melt point, lower resistance metals such as Silver (Ag) for increased performance in terms of signal propagation delay. It is also possible with the sintered, doped, glass-ceramic aggregate to fabricate a doped, LTCC insulating substrate for use as a glass-ceramic electrical wiring board suitable for a package on which various types of modules or semiconductor elements etc. are mounted, in which microwaves or millimeter waves are employed. Moreover, this sintered, doped crystallized glass-ceramic aggregate can make it possible to reduce variations in the production process of forming the doped, LTCC insulating substrate while also making it possible to maintain an adequate sintered density, so there are also no problems in terms of reliability such as a reduction in strength. In addition, this doped, crystallized glass-ceramic aggregate can be baked to form a doped, LTCC insulating substrate in a highly crystalline state even with a relatively small quantity of heat, and therefore it is also possible to lessen diffusion of a conductor metal into the glass-ceramic, so it is possible to realize an electrical wiring board. Examples of the doped, glass-ceramic aggregate used to form the doped, LTCC insulating substrate such as the doped, LTCC insulating layers 102(1)-102(4) in the electrical wiring board 100 in FIG. 1, will now be discussed below.

The glass material component of the doped, crystallized glass-ceramic aggregate used to fabricate the doped, LTCC insulating substrate, is crystallized glass upon which is deposited a diopside oxide crystal phase comprising at least Magnesium (Mg), Calcium (Ca), and Silicon (Si). A glass component such as this having a diopside crystal phase as the main phase reduces dielectric loss of the doped, crystallized glass-ceramic aggregate in high-frequency regions, such as above 1 GHz. The "crystallized glass upon which is deposited a diopside oxide crystal phase" (also referred to below as the "diopside crystallized glass") is a glass upon which a diopside crystal is deposited as the main crystal by means of baking. The diopside crystallized glass can include at least Magnesium (Mg), Calcium (Ca), and Silicon (Si), and preferably includes at least one metal selected from the group consisting of Aluminum (Al), Copper (Cu), Strontium (Sr), Zinc (Zn) and Titanium (Ti). It should be noted that the diopside crystallized glass in this example may comprise components other than those mentioned above within a range that does not detract from characteristics such as dielectric loss.

Magnesium (Mg) can be a constituent component of the diopside crystal in the diopside crystallized glass in this example. The content of Magnesium (Mg) in the diopside crystallized glass can be 5-30% weight in terms of Magnesium Oxide (MgO) equivalent with respect to the total weight of the diopside crystallized glass. If the Magnesium (Mg) content is excessively low, crystals may not readily be deposited, while if it is excessively high, there may be a difficulty in glass formation during production.

Calcium (Ca) can be another component of the diopside crystal in the diopside crystallized glass according to this example. The content of Calcium (Ca) in the diopside crystallized glass can be 10-30% weight in terms of Calcium Oxide (CaO) equivalent with respect to the total weight of the diopside crystallized glass. If the Calcium (Ca) content is excessively low, there may be an increase in dielectric loss, while if it is excessively high, there may be a difficulty in glass formation during production.

Silicon (Si) is a network former in the diopside crystallized glass according to this example while also being a constituent component of the diopside crystal. The content of Silicon (Si) can be 40-65% weight in terms of Silicon Dioxide ($SiO_2$) equivalent with respect to the total weight of the diopside crystallized glass. If the Silicon (Si) content is excessively low, there may be a difficulty in glass formation, while if it is excessively high, there tends to be a reduction in density.

Aluminum (Al) can be another component in the diopside crystallized glass regulating crystallinity of the glass in this example. The content of Aluminum (Al) can be 1-7% weight in terms of Aluminum Oxide ($Al_2O_3$) equivalent with respect to the total weight of diopside crystallized glass. If the Aluminum (Al) content is excessively low, the crystallinity may become excessively strong and there tends to be a difficulty in glass molding, while if it is excessively high, diopside crystals may not be readily deposited.

Copper (Cu) can be another component in the diopside crystallized glass, which donates electrons to a Silver (Ag) conductor and limits diffusion into the glass-ceramic aggregate. The content of Copper (Cu) can be 0.05-0.2% weight in terms of Copper Oxide (CuO) equivalent with respect to the total weight of the diopside crystallized glass component. If the Copper (Cu) content is excessively low, the abovementioned effect may not be adequately demonstrated, while if it is excessively high, there may be an excessive increase in dielectric loss.

Strontium (Sr), Zinc (Zn), and Titanium) can also be components for facilitating glass formation in the diopside crystallized glass. The content of each of these components can be 5.0-10.0% weight in terms of respective equivalents of Strontium Oxide (SrO), Zinc Oxide (ZnO), and Titanium Dioxide ($TiO_2$) with respect to the total weight of the diopside crystallized glass component. If the content of these components is excessively high, there may be a weakening of crystallinity in the diopside crystallized glass and a reduction in the amount of diopside deposition so that there may be an increase in dielectric loss.

In this example, the content of the diopside crystallized glass can be 60-80% weight with respect to the total weight of the doped, crystallized glass-ceramic aggregate as a whole. The mechanical strength may be improved by setting the content of the diopside crystallized glass component in the abovementioned range.

In another example, the diopside crystallized glass can include a 5-30% weight of Magnesium Oxide (MgO), a 10-30% weight of Calcium Oxide (CaO), a 40-65% weight of Silicon Dioxide ($SiO_2$), and a weight of 1-7% Aluminum Oxide ($Al_2O_3$) wherein the combined weight of the MgO, CaO, $SiO_2$, and $Al_2O_3$ does not exceed 100% of the weight of the crystallized glass.

The diopside crystallized glass is also doped in this example with Iron (Fe) and/or Manganese (Mn) in terms of respective equivalents of Iron Oxide ($Fe_2O_3$) or Manganese Oxide (MnO). As discussed above, it has been found through experimentation that the dielectric loss tangent of the sintered, doped, crystallized glass-ceramic aggregate formed from the diopside crystallized glass can be lowered by the introduction of Iron (Fe) and/or Manganese (Mn). The content of each of Iron (Fe) and/or Manganese (Mn) can be 200 parts per million (ppm) and 600 ppm in terms of respective equivalents of Iron Oxide ($Fe_2O_3$) or Manganese Oxide (MnO) of the diopside crystallized glass component.

The ceramic filler in the doped, cratalized glass-ceramic aggregate contributes to improving mechanical strength and regulating dielectric characteristics of the doped, crystallized glass-ceramic aggregate. There is no particular limitation as to the ceramic filler contained in the doped, crystallized glass-ceramic aggregate in this example, but ceramic fillers or the like may be formed by at least one material selected from the group consisting of: alumina, magnesia, spinel, silica, mullite, forsterite, steatite, cordierite, strontium, feldspar, quartz, zinc silicate, zirconia and titania. For example, the ceramic filler may be Aluminum Oxide ($Al_2O_3$), and can be a plate-shaped alumina filler. It should be noted that the ceramic filler in this example may include components other than those mentioned above within a range that does not detract from the characteristics of the doped, crystallized glass-ceramic aggregate, such as its dielectric loss and loss tangent. There is no particular limitation as to the shape of the ceramic filler, and a plate shape or spherical shape, or an indefinite shape etc. may be used. Furthermore, there is no particular limitation as to the mean particle size of the ceramic filler, but it can be 2-10 micrometers (µm), and preferably 2-5 µm. Furthermore, in this example, the content of the ceramic filler can be 20-40% weight with respect to the doped, crystallized glass-ceramic aggregate as a whole. It is possible to realize a doped, crystallized glass-ceramic aggregate having outstanding sintering properties without any defects such as voids.

The composite oxide contained in the doped, crystallized glass-ceramic aggregate in this example can include Aluminum (Al) and/or Cobalt (Co). This kind of composite oxide promotes crystallization of the diopside crystallized glass, and contributes to reducing dielectric loss in the doped, crystallized glass-ceramic aggregate as well. The composite oxide contained in the doped, crystallized glass-ceramic aggregate in this example can also additionally include Titanium (Ti). It should be noted that the composite oxide according to this example may include components other than those mentioned above within a range that does not detract from characteristics such as dielectric loss. Examples of components other than those mentioned above which may be cited include Manganese (Mn) and Copper (Cu), for example. The content of Aluminum (Al) in the composite oxide in this example is preferably 10% weight in terms of Aluminum Oxide ($Al_2O_3$) equivalent, with respect to the total weight of the composite oxide. The content of Cobalt (Co) in the composite oxide in this example is preferably 15% weight in terms of Cobalt Oxide (CoO) equivalent, with respect to the total weight of the composite oxide. The content of Titanium (Ti) in the composite oxide in this example is preferably 75% weight in terms of Titanium Dioxide ($TiO_2$) equivalent, with respect to the total weight of the composite oxide. In addition, the total content of Aluminum (Al), Cobalt (Co) and Titanium (Ti) in the composite oxide in this example can be at least 90% weight in terms of the total of the abovementioned oxide equivalents, with respect to the total weight of the composite oxide. The effect of reducing dielectric loss can be enhanced by setting the total content in the abovementioned range. Furthermore, according to this example, the content of composite oxide comprising at least Aluminum (Al) and Cobalt (Co) may preferably be greater than 0, but no greater than 2 mass percentage, more preferably 0.05-1.5 mass percentage, and even more preferably 0.1-0.5 mass percentage, with respect to the weight of the doped, crystallized glass-ceramic aggregate as a whole.

Figure 3:
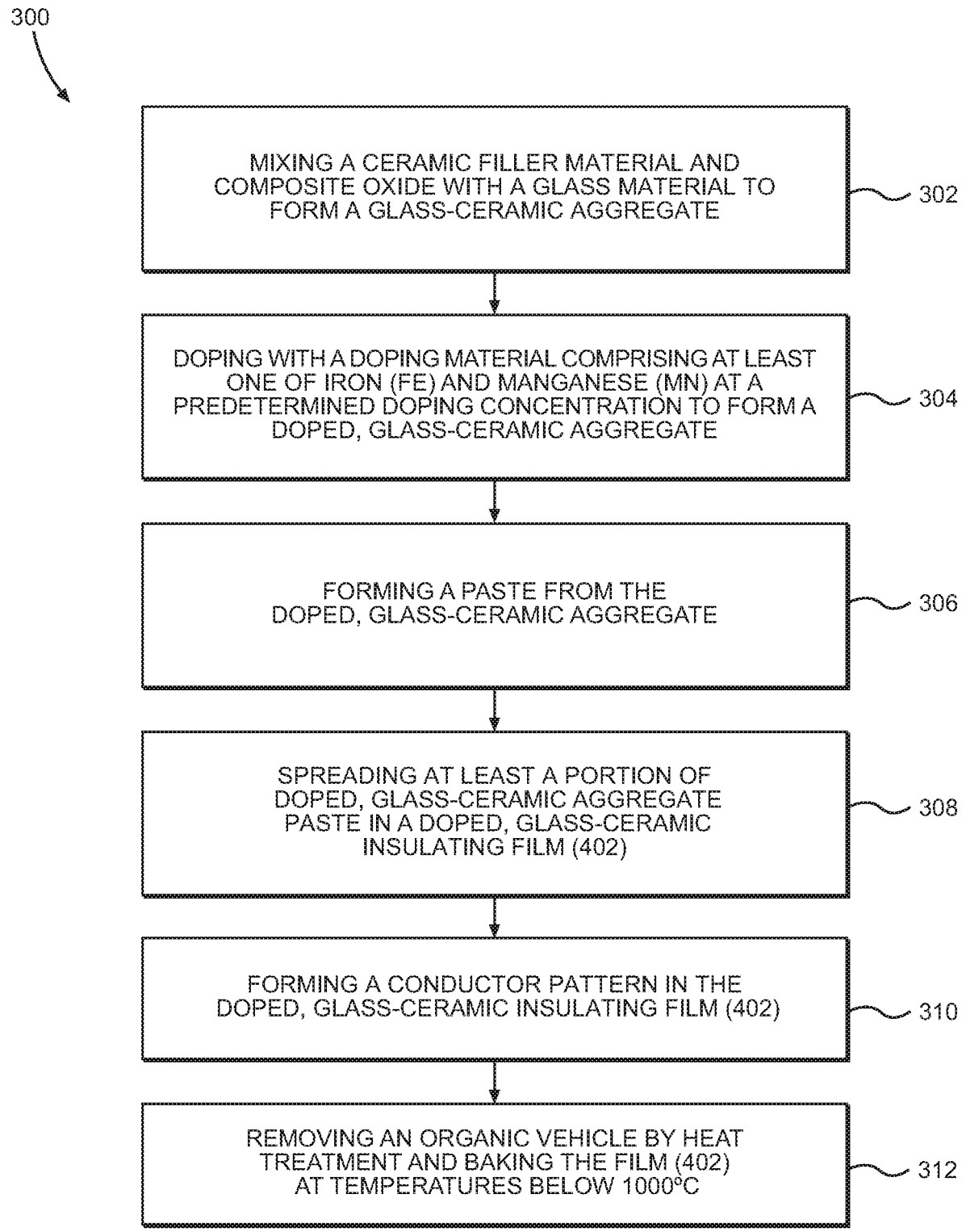
FIG. 3 is a flowchart illustrating an exemplary process of fabricating an electrical wiring board, like the electrical wiring board in FIG. 1, employing stacked Iron- or Manganese-doped, low-temperature co-fired glass-ceramic (LTCC) layers.

FIG. 3 is a flowchart illustrating an exemplary process 300 of fabricating Iron- or Manganese-doped, low-temperature co-fired glass-ceramic (LTCC) insulating substrates that can be included in an electrical wiring board, including those stacked LTCC insulating layers 102(1)-102(4) forming the electrical wiring board 100 in FIG. 1. The exemplary steps in the process 300 in FIG. 3 will be discussed in conjunction with the exemplary fabrication stages 400(1)-400(3) of the electrical wiring board 100 shown in FIGS. 4A-4C.

In this regard, as shown in FIG. 3, a first exemplary step of fabricating each of the doped, LTCC insulating layers 102(1)-102(4) is to fabricate a doped, crystallized glass-ceramic substrate, which may be used as an insulating substrate. As discussed above, this process includes mixing a ceramic filler material and composite oxide with a glass material to form a glass-ceramic aggregate (block 302). As discussed above, the glass material can include at least one of Magnesium (Mg), Calcium (Ca), and Silicon (Si), and preferably may include at least one metal selected from the group consisting of Aluminum (Al), Copper (Cu), Strontium (Sr), Zinc (Zn) and Titanium (Ti). Magnesium (Mg) can be a constituent component of the glass material in this example. The content of Magnesium (Mg) in the glass material can be 5-30% weight in terms of Magnesium Oxide (MgO) equivalent with respect to the total weight of glass material. Calcium (Ca) can be another constituent component of the glass material according to this example. The content of Calcium (Ca) can be 10-30% weight in terms of Calcium Oxide (CaO) equivalent with respect to the total weight of the glass material. Silicon (Si) is a network former in the glass material according to this example. The content of Silicon (Si) can be 40-65% weight in terms of Silicon Dioxide ($SiO_2$) equivalent with respect to the total weight of glass material. Aluminum (Al) can be another component in the glass material regulating crystallinity of the glass in this example. The content of Aluminum (Al) can be 1-7% weight in terms of Aluminum Oxide ($Al_2O_3$) equivalent with respect to the total weight of glass material. Copper (Cu) can be another component in the diopside crystallized glass, which donates electrons to a Silver (Ag) conductor and limits diffusion into the glass-ceramic aggregate. The content of Copper (Cu) can be 0.1% weight in terms of Copper Oxide (CuO) equivalent with respect to the total weight of glass material. Strontium (Sr), Zinc (Zn), and Titanium) can also be components for facilitating glass formation of the glass material. The content of each of these components can be is 5.0-10.0% weight in terms of respective equivalents of Strontium Oxide (SrO), Zinc Oxide (ZnO), and Titanium Dioxide ($TiO_2$) with respect to the total weight of the glass material. In another example, the glass material can include a 5-30% weight of Magnesium Oxide (MgO), a 10-30% weight of Calcium Oxide (CaO), a 40-65% weight of Silicon Dioxide ($SiO_2$), and a 1-7% weight of Aluminum Oxide ($Al_2O_3$), wherein the combined weight of the MgO, CaO, $SiO_2$, and $Al_2O_3$ does not exceed 100% of the weight of the glass material.

As also discussed above, the ceramic filler can include at least one material selected from the group consisting of: alumina, magnesia, spinel, silica, mullite, forsterite, steatite, cordierite, strontium, feldspar, quartz, zinc silicate, zirconia and titania. For example, the ceramic filler may be Aluminum Oxide ($Al_2O_3$), and can be a plate-shaped alumina filler. It should be noted that the ceramic filler in this example may include components other than those mentioned above within a range that does not detract from the characteristics of the doped, crystallized glass-ceramic aggregate, such as its dielectric loss and loss tangent. There is no particular limitation as to the shape of the ceramic filler, and a plate shape or spherical shape, or an indefinite shape etc. may be used. Furthermore, there is no particular limitation as to the mean particle size of the ceramic filler, but it can be 2-10 micrometers ($\mu\mu m$), and preferably 2-5 $\mu m$. Furthermore, in this example, the content of the ceramic filler can be 32.0% weight with respect to the glass-ceramic aggregate material as a whole.

The composite oxide contained in the glass material in this example can include Aluminum (Al) and/or Cobalt (Co). This kind of composite oxide promotes crystallization of the glass material, and contributes to reducing dielectric loss in the glass material. The composite oxide contained in the glass material in this example can also additionally include Titanium (Ti). It should be noted that the composite oxide according to this example may include components other than those mentioned above within a range that does not detract from characteristics such as dielectric loss. Examples of components other than those mentioned above which may be cited include Manganese (Mn) and Copper (Cu), for example. The content of Aluminum (Al) in the composite oxide in this example is preferably 10% weight in terms of Aluminum Oxide ($Al_2O_3$) equivalent, with respect to the total weight of the composite oxide. The content of Cobalt (Co) in the composite oxide in this example is preferably 15% weight in terms of Cobalt Oxide (CoO) equivalent, with respect to the total weight of the composite oxide. The content of Titanium (Ti) in the composite oxide in this example is preferably 75% weight in terms of Titanium Dioxide ($TiO_2$) equivalent, with respect to the total weight of the composite oxide. In addition, the total content of Aluminum (Al), Cobalt (Co) and Titanium (Ti) in the composite oxide in this example can be at least 90% weight in terms of the total of the abovementioned oxide equivalents, with respect to the total weight of the composite oxide. Furthermore, according to this example, the content of composite oxide comprising at least Aluminum (Al) and Cobalt (Co) may preferably be greater than 0, but no greater than 2 mass percentage, more preferably 0.05-1.5 mass percentage, and even more preferably 0.1-0.5 mass percentage, with respect to the weight of the glass material as a whole.

Furthermore, according to this mode of embodiment, the composite oxide refers to the use as a composite oxide comprising Aluminum (Al) and Cobalt (Co). The glass ceramic sintered compact according to the present invention can therefore not be obtained in the form of a single oxide such as Aluminum Oxide ($Al_2O_3$) or Cobalt Oxide (CoO) or Titanium Dioxide ($TiO_2$) corresponding to the constituent components of said composite oxide, even if the other starting materials mentioned above (the predetermined crystallized glass etc.) are added together therewith, so the action and effect of the present invention cannot be achieved either. That is to say, a composite oxide comprising Aluminum (Al) and Cobalt (Co) is not formed in the glass ceramic sintered compact obtained even if an oxide such as Aluminum Oxide ($Al_2O_3$) or Cobalt Oxide (CoO) is used in combination instead of a composite oxide comprising Aluminum (Al) and Cobalt (Co). The reason for this is that, although an oxide such as Aluminum Oxide ($Al_2O_3$) or Cobalt Oxide (CoO) corresponds to the constituent components of the abovementioned predetermined composite oxide, even if these are used alone, a chemical reaction to the extent that these oxides change to a composite oxide does not take place at the baking temperature of the glass ceramic sintered compact which will be described later.

A composite oxide which is combined in such a way that a predetermined composition is formed is therefore preferably used in the production method according to this mode of embodiment. For example, the abovementioned predetermined composite oxide may be prepared (produced) in accordance with the following production process. That is to say, the production process comprises a mixing step, a calcining step, a grinding step, and a drying step. These will be described in specific terms below. In terms of the mixing method, it is possible to use wet mixing or the like employing a ball mill, for example, and after the mixing, the mixture is dried, ground, and sieved, and then the calcining step is performed. In the calcining step, the mixture is maintained for a predetermined time at a temperature in the range of 800 degrees Celsius to 1300 degrees Celsius using an electric furnace or the like. There are no particular stipulations as to the atmosphere in this case, and any atmosphere is acceptable, but an oxidizing atmosphere is preferred. Furthermore, the holding time for calcination should be selected, as appropriate, in the range of 0.5-5.0 hours.

After the calcination, the calcined material is ground to a mean particle size of around 0.5 µm-2.0 µm, for example, in the grinding step. A ball mill or the like may be used as the grinding means. After the grinding, the finely-ground powder is dried in the drying step. Spray drying or the like may be used as the drying method. The composite oxide prepared in this way may then be used as a starting material. The abovementioned starting materials are then weighed out in accordance with the compositional ratio of the glass-ceramic sintered compact to be produced, and mixed to form a starting material powder. According to this mode of embodiment, the amount of glass component added is preferably 55-85 mass percentage and more preferably 65-75 mass percentage, within 100 mass percentage of the starting material powder. Furthermore, the content of ceramic filler component is preferably 20-40 mass percentage and more preferably 25-35 mass percentage within 100 mass percentage of the starting material powder. In addition, the content of the abovementioned predetermined composite oxide is preferably greater than 0 mass percentage but no greater than 2 mass percentage, more preferably 0.05-1.5 mass percentage and even more preferably 0.1-0.5 mass percentage, within 100 mass percentage of the starting material powder. If the composite oxide content is excessively high, partial crystallization starts before the glass as a whole has achieved a sufficiently fluid state, and this may cause problems such as a deterioration in sintering properties, specifically leading to an increase in internal voids, and not only a deterioration in characteristics but also less reliability due to the effect of the voids.

According to this mode of embodiment, there is no particular limitation as to the method of mixing, but it may be carried out by means of wet mixing employing a ball mill or the like with the addition of water or an organic solvent, and a binder or plasticizer or a dispersant etc., as required.

With continuing reference to FIG. 3, the glass-ceramic aggregate is doped with a doping material including at least one of Iron (Fe) and Manganese (Mn) at a predetermined doping concentration to form a doped, glass-ceramic aggregate (block 304). As discussed above, the content of each of Iron (Fe) and/or Manganese (Mn) can be 200 parts per million (ppm) and 600 ppm in terms of respective equivalents of Iron Oxide ($Fe_2O_3$) or Manganese Oxide (MnO) of the glass material.

A next step in the process 300 in FIG. 3 is to form a paste or slurry from the doped, glass-ceramic aggregate (block 306). The abovementioned starting material mixture (starting material powder) for the doped, glass-ceramic aggregate is formed into a paint and a paste for a green sheet is prepared to fabricate the doped, LTCC insulating substrate. The paste or slurry for a green sheet may be set up with an organic solvent in which the abovementioned starting material powder and an organic vehicle are kneaded, or it may be water based. Note that steps 302, 304, and 306 can be performed as one mixing step if desired. A next step in fabricating the doped, crystallized glass-ceramic substrate is to spread at least a portion of doped, glass-ceramic aggregate paste in a film (block 308). There is no particular limitation as to the amount of solvent or additives added thereto, and normal amounts thereof should be added, selected appropriately in accordance with the mixing apparatus used and the film thickness of the sheet formed in the subsequent steps. For example, when an organic vehicle is used, the content of the organic vehicle in the paste or slurry for a green sheet should be such that the binder is at around 5-15% weight and the solvent is at around 50% weight, with respect to 100% weight of the starting material powder. Furthermore, the various types of additives such as dispersants and plasticizers which are added, as required, preferably constitute no more than 10% weight of this total content. Moreover, examples of binders which may be mentioned include polyvinyl butyral resin and methacrylic acid resin. An example of a plasticizer which may be mentioned includes dibutyl phthalate. Examples of solvents which may be mentioned include toluene and methyl ethyl ketone. The resulting paste for a green sheet is formed as a film on a support such as a polyethylene terephthalate (PET) sheet, and a green sheet 10 is formed on the support. The method also comprises forming a conductor pattern in the film (block 310). The doped, glass-ceramic aggregate is then baked which causes an oxide crystal phase to be deposited in the glass material of the doped, crystallized glass-ceramic aggregate to form the doped, crystallized glass-ceramic substrate (block 312).

Figure 4A:
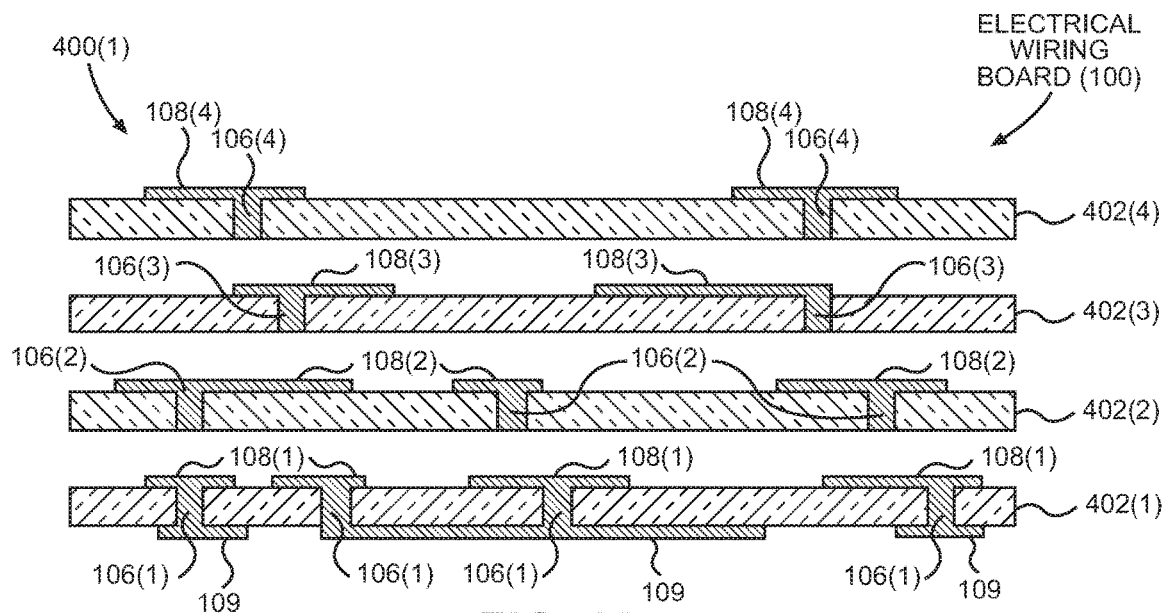
FIG. 4A is an exploded, cross-sectional view of multiple sheets of doped, glass-ceramic insulating films stacked above each other, wherein the doped, glass-ceramic insulating layers have surface and inner-layer conductor patterns formed therein, according to an exemplary fabrication stage of the process in FIG. 3.

FIG. 4A is an exploded, cross-sectional view of an exemplary fabrication stage 400(1) of fabricating a doped, crystallized glass-ceramic insulating substrate wherein multiple sheets of doped, glass-ceramic insulating films 402(1)-402(4) are stacked above each other. The doped, glass-ceramic insulating films 402(1)-402(4) have inter-layer conductor patterns 106(1)-106(4), inner-layer conductor patterns 108(1)-108(4), and surface conductor patterns 109 as previously discussed with regard to FIG. 1. The green sheets of the doped, glass-ceramic insulating films 402(1)-402(4) are prepared in the same way as a conventional glass-ceramic wiring board. The conductive paste which is used to form the conductor patterns 106(1)-106(4), 108(1)-108(4), 109 may be prepared by kneading an organic vehicle and a conductive material comprising various types of conductive metals or alloys, such as Silver (Ag), Silver-Palladium (Ag—Pd) alloy, Copper (Cu) and Nickel (Ni). The organic vehicle which is used in the conductive paste contains a binder and a solvent as the main components. There is no particular limitation as to the mixing ratio of the binder, solvent and conductive material, and 1-15 mass percentage of the binder and 10-50 mass percentage of the solvent may be mixed with the conductive material, for example. Additives selected from various types of dispersants and plasticizers etc. may be added to the conductive paste, as required.

Figure 4B:
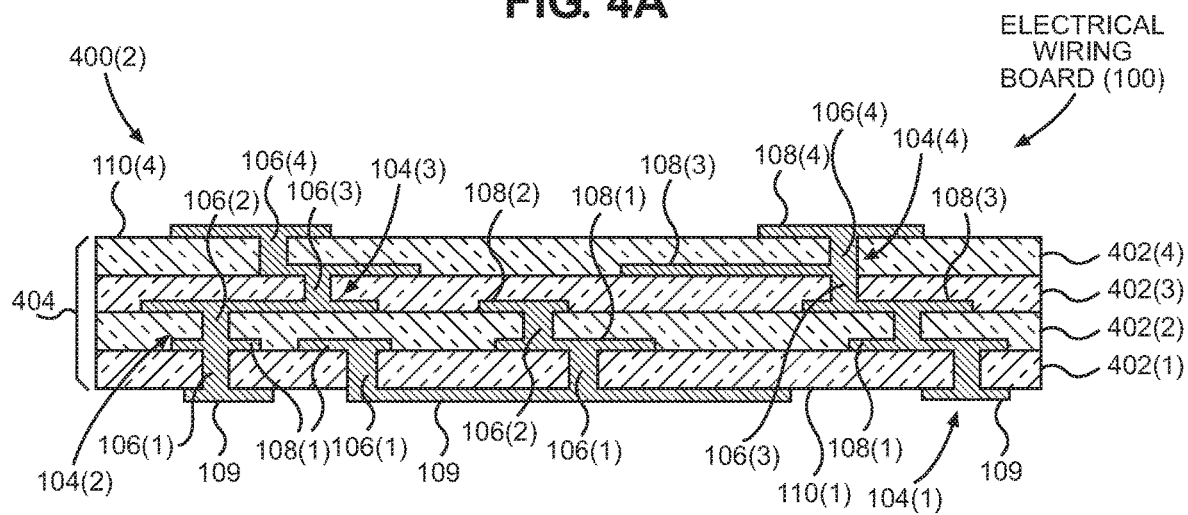
FIG. 4B is a cross-sectional view of the multiple sheets of the doped, glass-ceramic insulating films in FIG. 4A stacked on top of each other before baking, according to an exemplary fabrication stage of the process in FIG. 3.
Figure 4C:
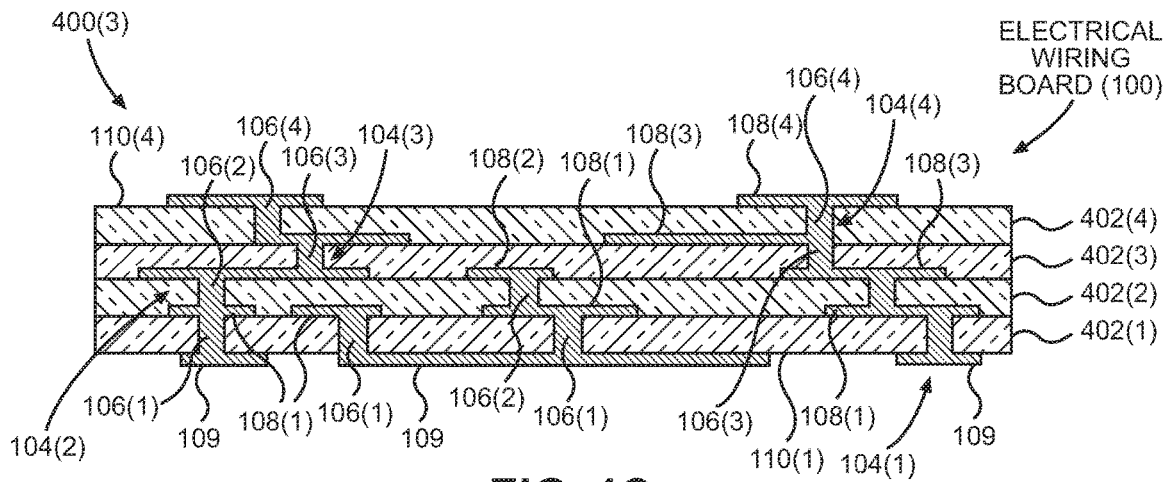
FIG. 4C is a cross-sectional view of substrate buildup of the multiple stacked sheets of the doped, glass-ceramic insulating layers in FIG. 4B after baking, according to an exemplary fabrication stage of the process in FIG. 3, to form the doped, LTCC insulating substrate in FIG. 1.

As shown fabrication stage 400(2) shown in FIG. 4B, green sheets of the doped, glass-ceramic insulating films 402(1)-402(4) form a stack 404 for the electrical wiring board 100 in FIG. 1. The stack 404 for the electrical wiring board 100 is pressed, after which components such as the organic vehicle in the stack 404 for a glass ceramic wiring board are removed under a heated air atmosphere and baking of the stack 404 is carried out under an air atmosphere below 1000 degrees Celsius in order to obtain the electrical wiring board 100 shown in the fabrication stage 400(3) in FIG. 4C. As a result of the baking, an oxide crystal phase in the glass material of the doped, glass-ceramic insulating films 402(1)-402(4) deposits crystals in the glass material to lower the dielectric constant and lower the loss tangent, and the doped, LTCC insulating layer 102(1)-102(4) is formed. In this example, the doping with Fe and/or Mn and the predetermined composite oxide added together with the glass material is believed to produce an action of promoting glass crystallization, and as a result it is possible to obtain a glass-ceramic sintered compact for high frequencies, especially for microwaves, by achieving a reduction in dielectric loss. It should be emphasized that Fe and/or Mn doping significantly enhances reduction in dielectric loss achieved with given composite oxide. In an example, the diopside crystallized glass can include a 5-30% weight of Magnesium Oxide (MgO), a 10-30% weight of Calcium Oxide (CaO), a 40-65% weight of Silicon Dioxide ($SiO_2$), and a 1-7% weight of Aluminum Oxide ($Al_2O_3$) wherein the combined weight of the MgO, CaO, $SiO_2$, and $Al_2O_3$ does not exceed 100% of the weight of the diopside crystallized glass.

In some cases, Gold (Au) may further be applied over the surface conductor patterns 109 by means of plating. In this case, a metal such as Nickel (Ni) or Palladium (Pd) may be applied as a base for the Gold (Au) plating.

Figure 5A:
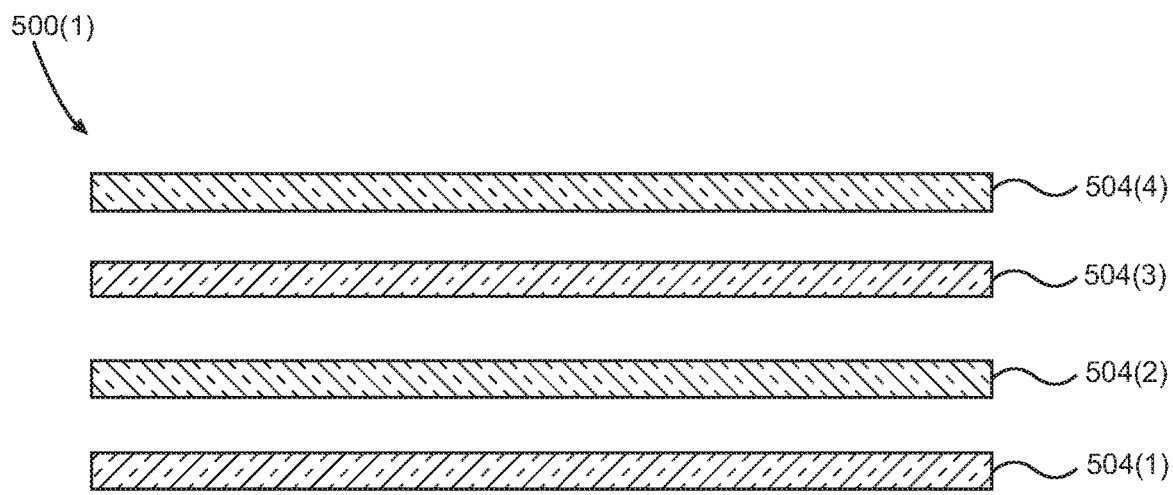
FIG. 5A is an exploded, cross-sectional view of multiple sheets of doped, glass-ceramic insulating films stacked above each other, wherein the doped, glass-ceramic insulating films have surface and inner-layer conductor patterns formed therein, according to an exemplary fabrication stage of the process in FIG. 3.
Figure 5B:
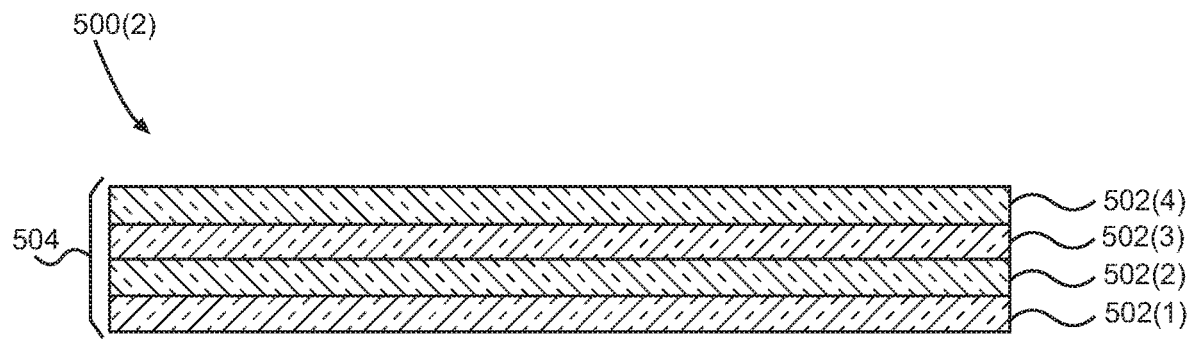
FIG. 5B is a cross-sectional view of the multiple sheets of the doped, glass-ceramic insulating films in FIG. 5A stacked on top of each other before baking, according to an exemplary fabrication stage of the process in FIG. 3.
Figure 6:
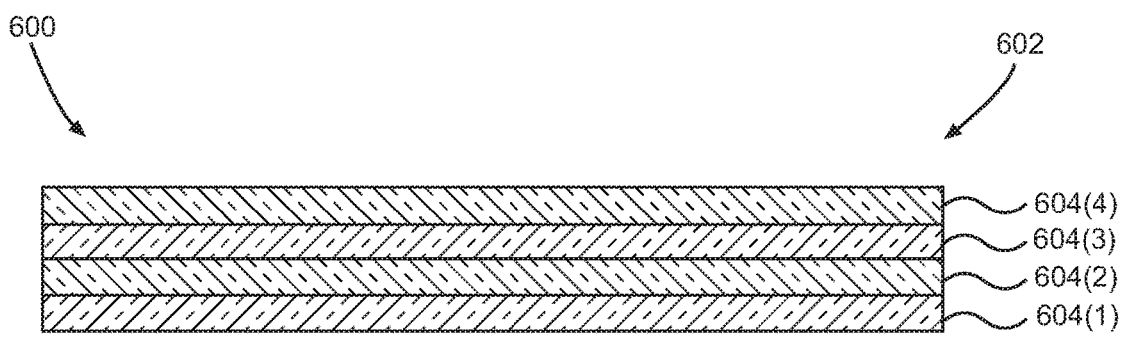
FIG. 6 is a cross-sectional view of the multiple stacked sheets of the doped, glass-ceramic insulating films in FIG. 5B after baking, according to an exemplary fabrication stage of the process in FIG. 3, to form the doped, LTCC insulating substrate in FIG. 1.

FIG. 5B is a cross-sectional view of another exemplary fabrication stage 502(2) wherein the multiple sheets of the doped, glass-ceramic insulating films 502(1)-502(4) in FIG. 5A are stacked on top of each other to form a stack 504. FIG. 6 shows an exemplary fabrication stage 600 of green sheets of the doped, glass-ceramic insulating films 502(1)-502(4) in the stack 504 after baking to form an electrical wiring board 602 of stacked respective doped, glass-ceramic insulating layers 604(1)-604(4). The material compositions and processes of fabricating the doped, glass-ceramic aggregate and the doped, glass-ceramic insulating layers discussed above are applicable for the examples in FIGS. 5A, 5B, and 6.

Composite Oxide of Aluminum Oxide ($Al_2O_3$), Cobalt Oxide ($CO_3O_4$), and Titanium Dioxide ($TiO_2$) in preferred concentrations (10% and 15% and 75% rest other oxides) have been prepared by usual solid state synthesis.

After this, the calcined material was finely ground by means of a ball mill until the mean particle size was 1.0 μm or smaller, after which the finely-ground powder was dried to obtain composite oxide powder.

EXAMPLES

A glass powder (comprising Silicon Dioxide ($SiO_2$)=50 mass percentage, Calcium Oxide (CaO)=16 mass percentage, Magnesium Oxide (MgO)=20 mass percentage, Aluminum Oxide ($Al_2O_3$)=5 mass percentage), an alumina filler (mean particle size 1.5 μm), composite oxide powder obtained in Production Example 1, and doping of Iron and/or Manganese were prepared, and each of the materials were weighed out.

19.4 g of acrylic resin, 59.1 g of toluene, 3 g of ethanol, and 6.5 g of a plasticizer (butyl phthalyl butyl glycolate) were then mixed in order to prepare an organic vehicle.

The glass powder, alumina filler and predetermined composite oxide powders which had been weighed out, and the organic vehicle prepared were then combined and mixed for 24 hours using a ball mill in order to prepare slurries for forming green sheets for a substrate.

The green sheets for a substrate were formed by means of a doctor blade process on a polyethylene terephthalate film It should be noted that the thickness of the green sheets was adjusted in such a way as to reach 50 μm after baking. Four (4) sheets were then stacked, after which they were pressed at 74 MPa, then baked under the atmosphere at 900 degrees Celsius under three condition of 120 minutes, and glass-ceramic sintered compacts were produced.

Evaluation of Glass Ceramic Sintered Compact

The glass-ceramic sintered compacts obtained were evaluated with regard to composition, dielectric constant, dielectric loss and relative density. It should be noted that the various items evaluated were evaluated by means of the following methods.

The compositions of the glass-ceramic sintered compacts obtained were analyzed. The compositional analysis was carried out by a method of analysis employing an X-ray fluorescence (XRF) analyzer. As a result, it was confirmed that the composition of each sintered compact was equivalent to the feed composition.

For the dielectric constant c and the dielectric loss tan δ, the characteristics at 60 GHz were evaluated by means of cavity resonator perturbation (in accordance with JISC2565). The glass ceramic sintered compacts were molded to a predetermined shape and evaluated. Specifically, the measurement was carried out by cutting glass-ceramic sintered compacts from the sintered substrate into a sheet shape of 10.0×10.0×0.2 mm, and the sheet-shaped samples which had been cut out were inserted into a cavity resonator which resonated at a specific frequency (e.g., 60 GHz). Furthermore, the cavity resonator was connected to a vector network analyzer produced by Agilent Technologies for measuring the state of the resonance peak in the cavity resonator, and to a computer for performing the analysis; the measurements were taken using this series of systems.

For the relative density of the sintered compacts, the specific gravity was measured (Sg) by means of the Archimedes method.

Relative density was estimated on basis of porosity measurements.

Another Example

The glass powder, alumina filler, and predetermined composite oxide and Iron doping powders, which had been weighed out, and the organic vehicle prepared were then combined and mixed for 24 hours using a ball mill in order to prepare paints for a green sheet for a substrate.

The paints for a green sheet for a substrate which had been prepared were formed as films by means of a doctor blade process on a polyethylene terephthalate film in order to form a plurality of green sheets for a substrate. It should be noted that the thickness of the green sheets was regulated in such a way as to reach 25 μm after baking.

After this, surface-layer conductor patterns (surface conductor pattern and mounting surface-terminal pattern) commensurate with the required circuits were formed by means of screen printing on a surface-layer green sheet. It should be noted that in this exemplary embodiment, the surface conductor pattern and the mounting surface-terminal pattern were formed by printing a silver paste in a predetermined pattern on the green sheet for a substrate disposed on the outermost side.

Furthermore, inner-layer conductor patterns (internal conductor pattern and via conductor pattern etc.) were also formed by means of screen printing in accordance with the required circuit for green sheets other than the surface-layer green sheet. It should be noted that according to this exemplary embodiment, the via conductor pattern was formed by forming through-holes (via holes) at predetermined positions in the green sheets for a substrate, and filling these holes with silver paste. Furthermore, the internal conductor pattern was formed by printing silver paste in a predetermined pattern on the surface of the green sheet for a substrate constituting the inner layer.

These green sheets were then stacked in a predetermined order, after which the stack was pressed at 74 MPa and baked for two hours at 900 degrees Celsius under the atmosphere, and an electrical wiring board 100 having a multilayer structure comprising the inter-layer conductors 106(1)-106(4), inner-layer conductors 108(1)-108(4), and outer surface conductors 109 for which the cross-sectional structure shown in FIG. 1 was obtained.

It should be noted that the total thickness of the glass ceramic wiring board after baking was 0.20 mm, and the thickness of the top surface-layer portion formed by the surface conductor 6 was 25 μm. After this, nickel was formed as a base on the surface conductor, after which gold plating was applied.

The glass ceramic wiring board obtained in this way had low dielectric loss in the high-frequency region, and it was confirmed that baking could be carried out at a low temperature of 1000 degrees Celsius or less using a low-resistance metal such as Gold (Au) or Silver (Ag) as a conductor layer.

Doped, LTCC insulating substrates formed from a baked (e.g., sintered) glass-ceramic substrate formed from an aggregate glass-ceramic mixture that includes a doped glass material (e.g., with Iron (Fe) or Manganese (Mn)), a ceramic filler material, and a composite oxide, and which may be used in an electrical wiring board, including but not limited to the doped, LTCC insulating layers 102(1)-102(4), 604(1)-604(4) in FIGS. 1, 4A-4C, 5A, 5B, and 6 are disclosed herein. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 7:
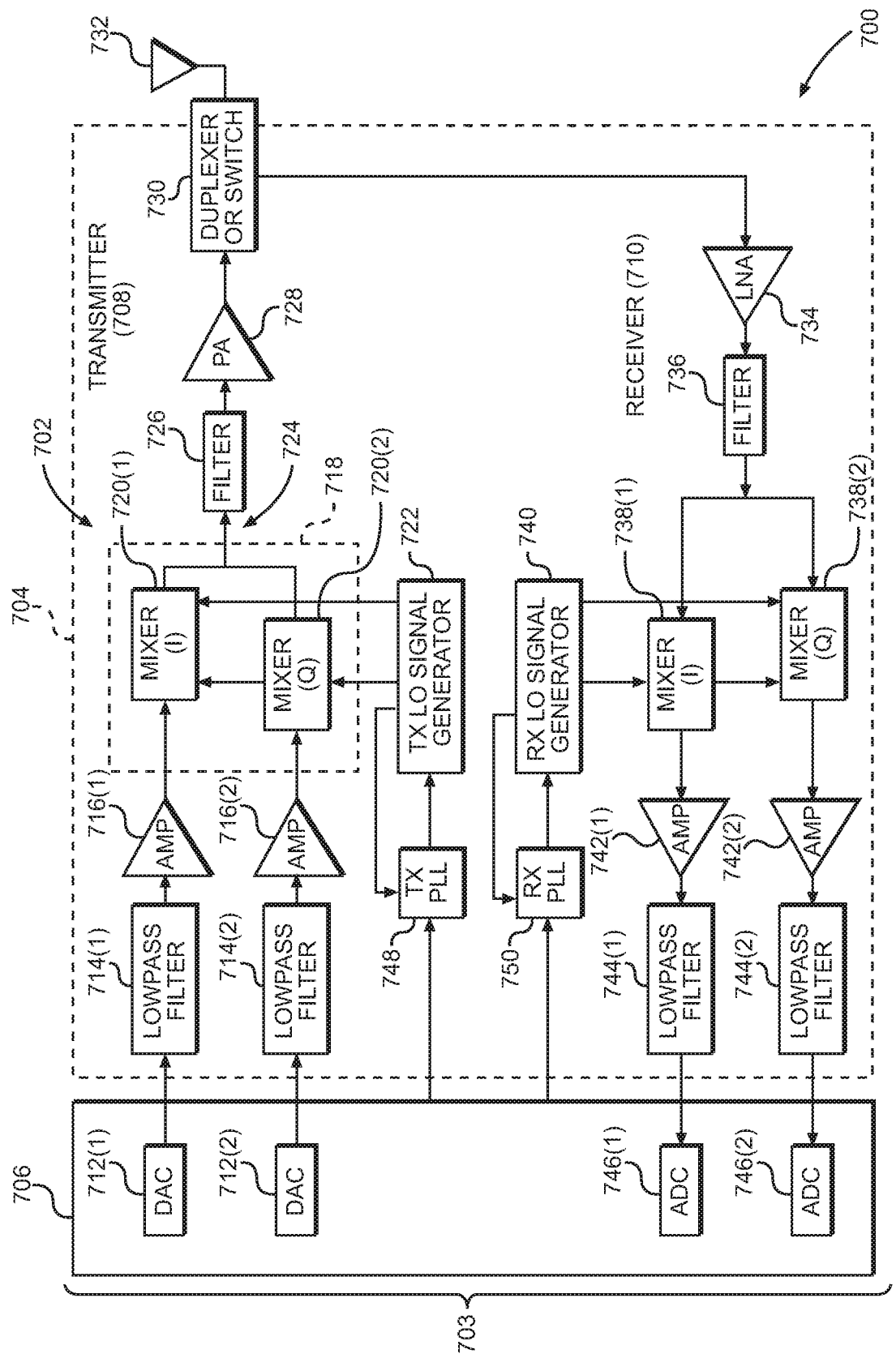
FIG. 7 is a block diagram of an exemplary wireless communications device that includes radio frequency (RF) components formed from an integrated circuit (IC), wherein any of the components therein can include an electrical wiring board(s) formed from a doped, LTCC insulating substrate including but not limited to the doped, LTCC insulating substrates in FIGS. 1, 4A-4C, 5A, 5B, and 6.

FIG. 7 illustrates an exemplary wireless communications device 700 that includes radio frequency (RF) components formed from an IC 702, wherein any of the components therein can include a doped, LTCC insulating substrate(s) 703 formed from a baked (e.g., sintered) glass-ceramic substrate formed from an aggregate glass-ceramic mixture that includes a doped glass material (e.g., with Iron (Fe) or Manganese (Mn)), a ceramic filler material, and a composite oxide, and which may be used in an electrical wiring board, including but not limited to the doped, LTCC insulating layers 102(1)-102(4), 604(1)-604(4) in FIGS. 1, 4A-4C, 5A, 5B, and 6, and according to any aspects disclosed herein. The wireless communications device 700 may include or be provided in any of the above referenced devices, as examples. As shown in FIG. 7, the wireless communications device 700 includes a transceiver 704 and a data processor 706. The data processor 706 may include a memory to store data and program codes. The transceiver 704 includes a transmitter 708 and a receiver 710 that support bi-directional communications. In general, the wireless communications device 700 may include any number of transmitters 708 and/or receivers 710 for any number of communication systems and frequency bands. All or a portion of the transceiver 704 may be implemented on one or more analog ICs, RF ICs (RFICs), mixed-signal ICs, etc.

The transmitter 708 or the receiver 710 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 710. In the direct-conversion architecture, a signal is frequency-converted between RF and baseband in one stage. The super-heterodyne and direct-conversion architectures may use different circuit blocks and/or have different requirements. In the wireless communications device 700 in FIG. 7, the transmitter 708 and the receiver 710 are implemented with the direct-conversion architecture.

In the transmit path, the data processor 706 processes data to be transmitted and provides I and Q analog output signals to the transmitter 708. In the exemplary wireless communications device 700, the data processor 706 includes digital-to-analog converters (DACs) 712(1), 712(2) for converting digital signals generated by the data processor 706 into the I and Q analog output signals, e.g., I and Q output currents, for further processing.

Within the transmitter 708, lowpass filters 714(1), 714(2) filter the I and Q analog output signals, respectively, to remove undesired signals caused by the prior digital-to-analog conversion. Amplifiers (AMP) 716(1), 716(2) amplify the signals from the lowpass filters 714(1), 714(2), respectively, and provide I and Q baseband signals. An upconverter 718 upconverts the I and Q baseband signals with I and Q transmit (TX) local oscillator (LO) signals through mixers 720(1), 720(2) from a TX LO signal generator 722 to provide an upconverted signal 724. A filter 726 filters the upconverted signal 724 to remove undesired signals caused by the frequency upconversion as well as noise in a receive frequency band. A power amplifier (PA) 728 amplifies the upconverted signal 724 from the filter 726 to obtain the desired output power level and provides a transmit RF signal. The transmit RF signal is routed through a duplexer or switch 730 and transmitted via an antenna 732.

In the receive path, the antenna 732 receives signals transmitted by base stations and provides a received RF signal, which is routed through the duplexer or switch 730 and provided to a low noise amplifier (LNA) 734. The duplexer or switch 730 is designed to operate with a specific receive RX-to-TX duplexer frequency separation, such that RX signals are isolated from TX signals. The received RF signal is amplified by the LNA 734 and filtered by a filter 736 to obtain a desired RF input signal. Downconversion mixers 738(1), 738(2) mix the output of the filter 736 with I and Q RX LO signals (i.e., LO_I and LO_Q) from an RX LO signal generator 740 to generate I and Q baseband signals. The I and Q baseband signals are amplified by amplifiers (AMP) 742(1), 742(2) and further filtered by lowpass filters 744(1), 744(2) to obtain I and Q analog input signals, which are provided to the data processor 706. In this example, the data processor 706 includes ADCs 746(1), 746(2) for converting the analog input signals into digital signals to be further processed by the data processor 706.

In the wireless communications device 700 of FIG. 7, the TX LO signal generator 722 generates the I and Q TX LO signals used for frequency upconversion, while the RX LO signal generator 740 generates the I and Q RX LO signals used for frequency downconversion. Each LO signal is a periodic signal with a particular fundamental frequency. A TX phase-locked loop (PLL) circuit 748 receives timing information from the data processor 706 and generates a control signal used to adjust the frequency and/or phase of the TX LO signals from the TX LO signal generator 722. Similarly, an RX PLL circuit 750 receives timing information from the data processor 706 and generates a control signal used to adjust the frequency and/or phase of the RX LO signals from the RX LO signal generator 740.

Figure 8:
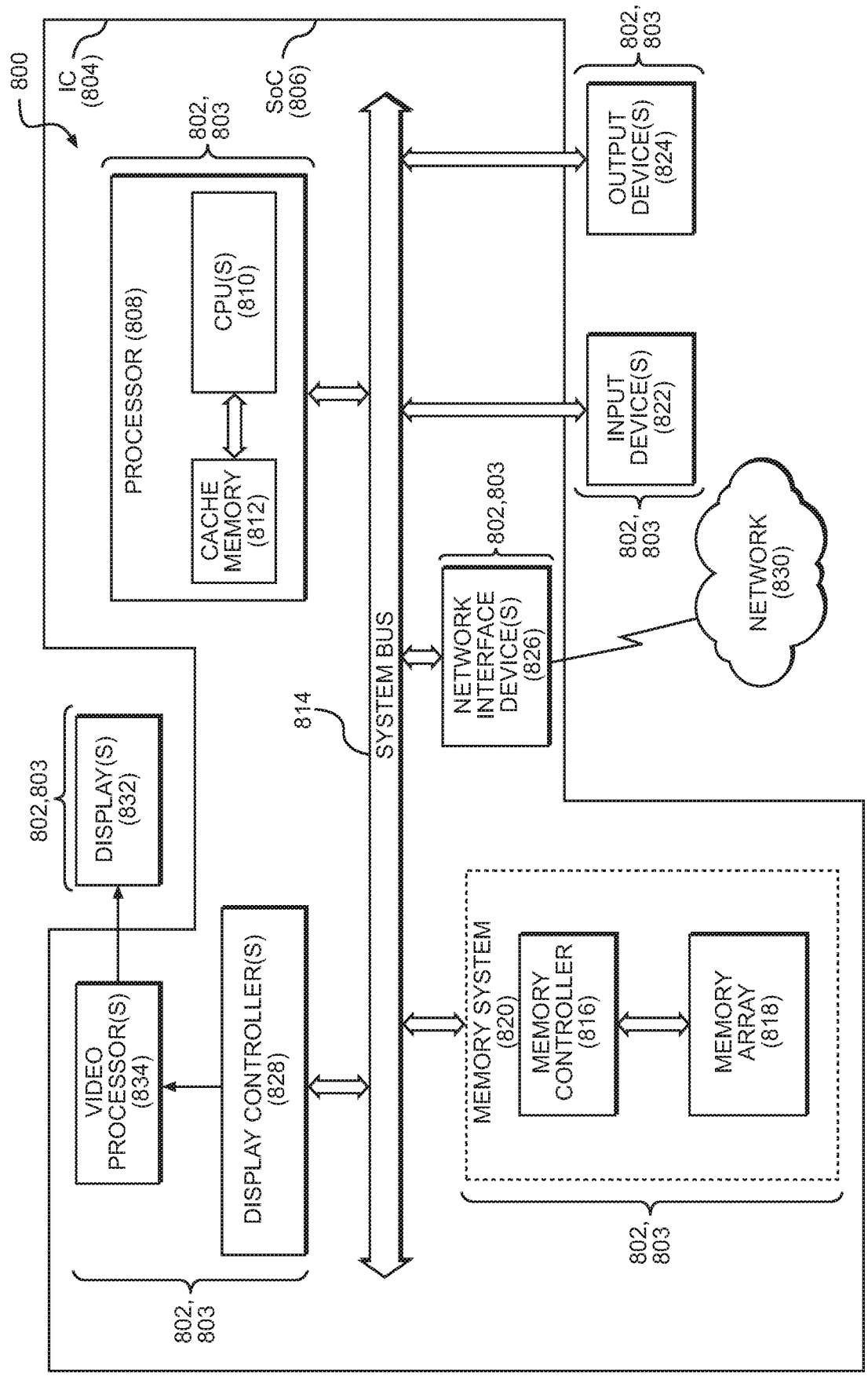
FIG. 8 is a block diagram of an exemplary processor-based system that can include an electrical wiring board(s) formed from a doped, LTCC insulating substrate including but not limited to the doped, LTCC insulating substrates in FIGS. 1, 4A-4C, 5A, 5B, and 6.

FIG. 8 illustrates an example of a processor-based system 800 that can include circuits 802 that include a doped, LTCC insulating substrate(s) formed from a baked (e.g., sintered) glass-ceramic substrate formed from an aggregate glass-ceramic mixture that includes a doped glass material (e.g., with Iron (Fe) or Manganese (Mn)), a ceramic filler material, and a composite oxide, and which may be used in an electrical wiring board, including but not limited to the doped, LTCC insulating layers 102(1)-102(4), 604(1)-604(4) in FIGS. 1, 4A-4C, 5A, 5B, and 6, and according to any aspects disclosed herein. The wireless communications device 700 may include or be provided in any of the above referenced devices, as examples. In this example, the processor-based system 800 may be formed as an IC 804 in a system-on-a-chip (SoC) 806, which may be mounted on the doped, LTCC insulating substrate 803. The processor-based system 800 includes a processor 808 that includes one or more central processor units (CPUs) 810, which may also be referred to as CPU(s) or processor cores. The processor 808 may have cache memory 812 coupled to the processor(s) 808 for rapid access to temporarily stored data. The processor 808 is coupled to a system bus 814 and can intercouple master and slave devices included in the processor-based system 800. As is well known, the processor 808 communicates with these other devices by exchanging address, control, and data information over the system bus 814. For example, the processor 808 can communicate bus transaction requests to a memory controller 816 as an example of a slave device. Although not illustrated in FIG. 8, multiple system buses 814 could be provided, wherein each system bus 814 constitutes a different fabric.

Other master and slave devices can be connected to the system bus 814. As illustrated in FIG. 8, these devices can include a memory system 820 that includes the memory controller 816 and a memory array(s) 818, one or more input devices 822, one or more output devices 824, one or more network interface devices 826, and one or more display controllers 828, as examples. Each of the memory system 820, the one or more input devices 822, the one or more output devices 824, the one or more network interface devices 826, and the one or more display controllers 828 can include circuits 802 that include a doped, LTCC insulating substrate(s) formed from a baked (e.g., sintered) glass-ceramic substrate formed from an aggregate glass-ceramic mixture that includes a doped glass material (e.g., with Iron (Fe) or Manganese (Mn)), a ceramic filler material, and a composite oxide, and which may be used in an electrical wiring board, including but not limited to the doped, LTCC insulating layers 102(1)-102(4), 604(1)-604(4) in FIGS. 1, 4A-4C, 5A, 5B, and 6, and according to any aspects disclosed herein. The input device(s) 822 can include any type of input device, including, but not limited to, input keys, switches, voice processors, etc. The output device(s) 824 can include any type of output device, including, but not limited to, audio, video, other visual indicators, etc. The network interface device(s) 826 can be any device configured to allow exchange of data to and from a network 830. The network 830 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 826 can be configured to support any type of communications protocol desired.

The processor 808 may also be configured to access the display controller(s) 828 over the system bus 814 to control information sent to one or more displays 832. The display controller(s) 828 sends information to the display(s) 832 to be displayed via one or more video processor(s) 834, which process the information to be displayed into a format suitable for the display(s) 832. The display(s) 832 can include any type of display, including, but not limited to, a cathode ray tube (CRT), a liquid crystal display (LCD), a plasma display, a light emitting diode (LED) display, etc.

Any of the components in the processor-based system 800 in FIG. 8, including but not limited to the IC 804, the SoC 806, the processor 808, the memory controller 816, the memory array(s) 818, the input device(s) 822, the output device(s) 824, the network interface device(s) 826, the display controller(s) 828, and/or the display(s) 832 may be mounted on an electrical wiring board formed from a baked (e.g., sintered) glass-ceramic substrate formed from an aggregate glass-ceramic mixture that includes a doped glass material (e.g., with Iron (Fe) or Manganese (Mn)), a ceramic filler material, and a composite oxide, and which may be used in an electrical wiring board, including but not limited to the doped, LTCC insulating substrates in FIGS. 1, 4A-4C, 5A, 5B, and 6, and according to any aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A doped, glass-ceramic substrate, comprising:
   a crystallized glass-ceramic aggregate, comprising:
      a crystalized glass on which an oxide crystal phase is deposited;
      a ceramic filler material; and
      a composite oxide; and
   a doping material doped at a doping concentration level between 200 parts per million (ppm) and 600 ppm in the crystallized glass-ceramic aggregate, the doping material comprising Iron Oxide ($Fe_xO_y$),
   wherein the crystallized glass comprises a 5-30% weight of MgO, a 10-30% weight of CaO, a 40-65% weight of $SiO_2$, and a 1-7% weight of Aluminum Oxide $Al_2O_3$ and wherein a combined weight of the MgO, CaO, SiO, and $Al_2O_3$ does not exceed 100% of the weight of the crystallized glass.

2. The doped, glass-ceramic substrate of claim 1, wherein the oxide crystal phase comprises a diopside oxide crystal phase.

3. The doped, glass-ceramic substrate of claim 1, wherein the composite oxide comprises Aluminum (Al) and Cobalt (Co).

4. The doped, glass-ceramic substrate of claim 1, wherein the composite oxide comprises Titanium (Ti).

5. The doped, glass-ceramic substrate of claim 1, wherein the ceramic filler comprises $Al_2O_3$.

6. An electrical wiring board, comprising:
   at least one insulating layer; and
   at least one wiring conductor integrated into the at least one insulating layer, the at least one insulating layer comprising:
      a crystallized glass-ceramic aggregate, comprising:
         a crystalized glass on which an oxide crystal phase is deposited;
         a ceramic filler material; and
         a composite oxide; and
      a doping material doped at a doping concentration level between 200 parts per million (ppm) and 600 ppm in the crystallized glass-ceramic aggregate, the doping material comprising Iron Oxide ($Fe_xO_y$,
         wherein the crystallized glass comprises a 5-30% weight of MgO, a 10-30% weight of CaO, a 40-65% weight of $SiO_2$, and a 1-7% weight of $Al_2O_3$, and wherein a combined weight of the MgO, CaO, $SiO_2$, and $Al_2O_3$ does not exceed 100% of the weight of the crystallized glass.

7. The electrical wiring board of claim 6, wherein the oxide crystal phase comprises a diopside oxide crystal phase.

8. The electrical wiring board of claim 6 further comprising at least one integrated circuit (IC).

9. The electrical wiring board of claim 6 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *